United States Patent [19]

Araps et al.

[11] Patent Number: 4,656,050

[45] Date of Patent: * Apr. 7, 1987

[54] METHOD OF PRODUCING ELECTRONIC COMPONENTS UTILIZING CURED VINYL AND/OR ACETYLENE TERMINATED COPOLYMERS

[75] Inventors: Constance J. Araps, Wappingers Falls; Steven M. Kandetzke, Fishkill; Mark A. Takacs, Poughkeepsie, all of N.Y.

[73] Assignee: International Business Machines Corporation, Armonk, N.Y.

[*] Notice: The portion of the term of this patent subsequent to Mar. 31, 2004 has been disclaimed.

[21] Appl. No.: 839,449

[22] Filed: Mar. 11, 1986

Related U.S. Application Data

[63] Continuation of Ser. No. 556,734, Nov. 30, 1983, abandoned.

[51] Int. Cl.$^4$ ................................................. B05D 5/12
[52] U.S. Cl. ................................. 427/12; 427/54.1; 427/82; 427/96; 427/337; 427/385.5; 430/319
[58] Field of Search ................. 427/82, 96, 54.1, 35, 427/337, 385.5, 12; 148/DIG. 168; 430/319; 29/576 W

[56] References Cited

U.S. PATENT DOCUMENTS

| | | | |
|---|---|---|---|
| 3,486,934 | 12/1969 | Bond et al. | 117/218 |
| 3,515,585 | 6/1970 | Chamberlin et al. | 117/212 |
| 3,700,497 | 10/1972 | Epifano et al. | 117/212 |
| 3,766,438 | 10/1973 | Castrucci et al. | 317/101 A |
| 3,846,166 | 11/1974 | Saiki et al. | 117/212 |
| 3,961,355 | 6/1976 | Abbas et al. | 357/49 |
| 3,985,597 | 10/1976 | Zielinski | 156/11 |
| 4,030,948 | 6/1977 | Berger | 148/33.3 |
| 4,104,086 | 8/1978 | Bondur et al. | 148/1.5 |
| 4,139,442 | 2/1979 | Bondur et al. | 204/192 E |
| 4,160,991 | 7/1979 | Anantha et al. | 357/49 |
| 4,258,146 | 3/1981 | Balanson et al. | 525/106 |
| 4,333,794 | 6/1982 | Beyer et al. | 156/648 |
| 4,347,306 | 8/1982 | Takeda et al. | 430/270 X |
| 4,353,778 | 10/1982 | Fineman et al. | 156/644 |
| 4,367,119 | 1/1983 | Logan et al. | 156/643 |

OTHER PUBLICATIONS

Kaiser et al, "A Fabrication Technique for Multilayer Ceramic Modules", *Solid State Technology*, May 1972, pp. 35–40.

Mukai et al, "Planar Multilevel Interconnection Technology Employing a Polyimide", IEE Journal of Solid-State Circuits, vol. 13, No. 4, Aug. 1978, pp. 462–467.

*Primary Examiner*—Richard Bueker
*Attorney, Agent, or Firm*—Shirley Church Moore

[57] ABSTRACT

A method of producing electronic components is disclosed wherein an insulator is in situ cured. The insulator is comprised of a polymerizable oligomer end capped with vinyl and/or acetylenic end groups which both imidize and cross-link upon cure to provide a three-dimensional dielectric network.

25 Claims, No Drawings

METHOD OF PRODUCING ELECTRONIC COMPONENTS UTILIZING CURED VINYL AND/OR ACETYLENE TERMINATED COPOLYMERS

This application is a continuation of Ser. No. 556,734, filed Nov. 30, 1983 and now abandoned.

BACKGROUND OF THE INVENTION

1. Field of the Invention

The present invention relates to methods of producing electronic components utilizing cured vinyl and/or acetylene terminated polymerizable oligomers.

2. Description of the Prior Art

There is a significant interest in the semiconductor industry in replacing traditional inorganic dielectric materials with polymeric materials as device deep dielectric isolation (often termed trenches in the art) etc., and as interlevel metal passivation layers, etc. Polymeric materials are less expensive, can be more easily purified and fabricated, and potentially have better thermal and electrical characteristics than some inorganic counterparts.

In the monolithic integrated circuit technology, it is usually necessary to isolate various active and passive elements from one another in the integrated circuit structure. These devices have been isolated by back biasing, PN junctions, partial dielectric isolation and complete dielectric isolation. The dielectric materials used have been silicon dioxide, glass, polymers and the like.

The preferred isolation for such active devices and circuits is some form of dielectric isolation because it permits the circuit elements and the like to be adjacent the isolation and thereby result in greater density of packing of the active and passive devices on the integrated circuit chip.

It is also known that recessed dielectric isolation can be produced by first selectively removing silicon from a substrate so as to form trenches in the substrate and then filling the trenches with a dielectric material.

In the interest of minimizing the silicon chip area occupied by the dielectrically filled trenches, sputter etching processes and reactive ion etching processes have been utilized to form the trenches in the silicon substrate.

The following U.S. patents disclose various electronic devices involving the use of such dielectric isolation. These references are hereby incorporated by reference since the dielectric isolation of the present invention can be used in forming devices as taught in these references. U.S. Pat. Nos. 3,766,438 Castrucci et al.; 3,961,355 Abbas et al.; 4,104,086 Bondur et al.; 4,139,442 Bondur et al.; 4,160,991 Anantha et al.; and 4,333,794 Beyer et al.

U.S. Pat. No. 4,030,948 Berger discloses the use of polyimide containing silicones which are deposited in a moat or groove 114 employed to control leakage across the end portions of PN junction 102. This patent is also hereby incorporated by reference since the dielectric material of the present invention can be substituted for the polyimide containing silicones of Berger.

The above-mentioned U.S. Pat. No. 4,333,794 Beyer et al. discloses in FIG. 14 a polyimide isolation as represented by numeral 66 formed by applying a conventional polyimide material such as Monsanto Skybond and then etching back in $O_2$ plasma at room temperature. Mechanical stresses near the side wall are stated to be reduced, the polyimides are stated to have excellent planarization capability and to boost device performance since they have a lower dielectric constant than $SiO_2$.

U.S. Pat. No. 4,353,778 Fineman et al. discloses a method of etching openings in a polyimide film which can be used in an electronic device. The polyimide material is applied as polyamic acid and then partially cured and, following processing steps, the polyimide is again cured to crosslink the same so that it will resist attack by a strong base.

U.S. Pat. No. 4,347,306, Takeda et al. discloses a method for manufacturing electronic devices having a multilayer wiring structure using a polyimide dielectric material between the layers. The polyimide dielectric material is a thermosetting addition polymerization type polyimide which possesses imide range in recurring units and a degree of polymerization which increases when cured due to the radical reaction of the end group or groups thereof. The materials of the present invention differ in structure, have superior properties and are cured by a different method from that disclosed in Takeda et al.

The following U.S. patents disclose polyimides, polyimide-polyamides or like materials used as insulating or passivating materials in electronic components. However, none of the materials disclosed are equivalent to those of the present invention: U.S. Pat. Nos. 3,700,497 Epifano et al.; 3,846,166 Saiki et al.; 3,486,934 Bond; 3,515,585 Chamberlin et al.; 3,985,597 Zielinski; and 4,367,119 Logan et al.

SUMMARY OF THE INVENTION

The present invention provides a method of producing an electronic component utilizing a three-dimensional cured product of a vinyl and/or acetylene terminated polyamic acids, the corresponding polyamic esters, the corresponding polyisoimides, and mixtures thereof. Hereafter such materials are often merely referred to generically as "oligomers" for brevity and the cured three-dimensional reaction product thereof is often merely referred to as a "cured polyimide" for brevity.

Major objects of the present invention are to provide dielectric and/or passivating materials for use in electronic component fabrication which are formed from oligomeric materials which have high solubility in conventional process solvents to provide a coating solution of excellent wetting and planarizing properties and which can be used, for example, to provide device deep dielectric isolation and which can be cured to provide a polyimide which is free of voids, bubbles, cracks, blistering, delamination or excess shrinkage, which cured polyimide exhibits excellent adhesion, thermal stability, electrical properties and chemical resistance.

DESCRIPTION OF PREFERRED EMBODIMENTS

The major advantage of the polymerizable oligomers of the present invention and the resulting cured polyimide of the present invention is that the polymerizable oligomers of the present invention essentially can be used to fill a device deep dielectric isolation or trench in a manner similar to a monomer (providing excellent wetting, filling and planarizing capability) but can be totally cured or reacted to provide a high molecular weight cured polyimide which exhibits properties quite dissimilar from the polymerizable oligomer which are most suited for device deep dielectric isolation.

The main criterion which the oligomers of the present invention illustrate is that they are substituted with reactive terminae, specifically, with vinyl and/or acetylene groups, which permits them to be thermally or catalytically cured to yield a cross-linked three-dimensional dielectric material suitable for dielectric isolation, most especially deep device dielectric isolation (hereafter often merely referred to as "trench isolation" for brevity), or passivation in an electronic component.

One major advantage of the present invention is that since the cured polyimide is not present in the form of a thin film, problems with stress resulting from high temperature curing (or cross-linking) are not encountered to the extent that such stress problems are encountered with a thin film. Accordingly, per the present invention it is not necessary to catalytically cure the polymerizable oligomer of the present invention, rather, a simpler and less expensive thermal cure can be used. Accordingly, though later discussion is offered with respect to a catalytic cure, it is to be appreciated that this is a non-preferred embodiment of the present invention.

Although the cured polyimides of the present invention find particular application as a trench filling material, the cured polyimides of the present invention can be used in any application where dielectric isolation and/or passivation is required in an electric component, for example, as a replacement for the ceramic layers in a multilayer ceramic module, see, for example, SOLID STATE TECHNOLOGY, May 1972, Vol. 15, No. 5, pages 35-40, Kaiser et al, hereby incorporated by reference.

Major advantages of the oligomers of the present invention are later discussed. They are polyamic acids, polyamic esters, polyisoimides and mixtures thereof that are end-capped or terminated with reactive functional groups and can be dissolved in common organic solvents to a very high solids content, e.g., as high as about 70 to 80 weight percent can be readily coated onto devices to fill trenches, and are easily planarized, that is, result in an extremely smooth, defect-free surface, and can then be thermally or optionally catalytically cured to provide a cross-linked three-dimensional network which results in a cured polyimide of high molecular weight and good thermal and chemical properties. This is opposed to conventional polyimides which cure to yield a two-dimensional network.

The Polymerizable Oligomers of the Present Invention

The polymerizable oligomers of the present invention include polyamic acidss the corresponding polyamic ester, the corresponding isoimide and mixtures thereof. They can be represented by the formulae of the type later set out.

As can be seen from the formulae, the end groups of the polymerizable oligomers are end-capped with a vinyl or acetylinic end group.

They are available under the trade names Thermid LR-600 (polyamic acid), Thermid AL-600 (polyamic ester) and Thermid IP-600 (polyisoimide) from the Natural Starch and Chemical Corp.

As obtained, they typically have a molecular weight on the order from about 600 to about 10,000, determined by GPC.

As one skilled in the art will appreciate, the molecular weights of the polymerizable oligomers of the present invention cannot be specified as a completely definite range since there is a variability in useful molecular weights depending upon the exact polymerizable oligomer selected, the solvent selected, the desire or non-desire to use multiple polymerizable oligomer applications, the desire or non-desire to have low solvent concentrations and like considerations as will be apparent to one skilled in the art. However, for most commercial process line operations, it is contemplated that useful polymerizable oligomers will have a number average molecular weight in the range of from about 1,500 to about 8,000 as determined by GPC (herein molecular weights are on the same basis unless otherwise indicated). Currently preferred polymerizable oligomers have a molecular weight of from about 2,000 to about 4,000.

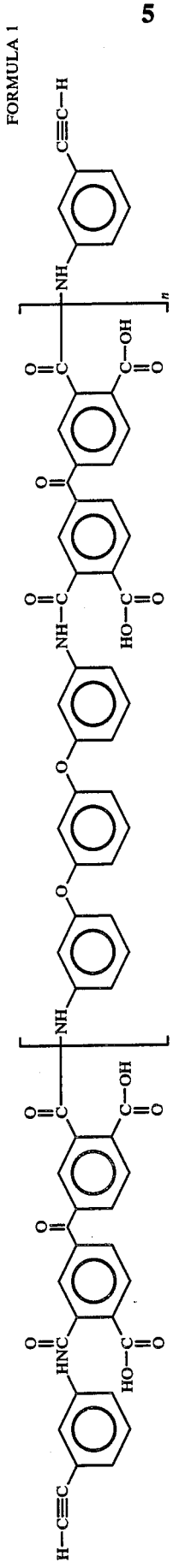
FORMULA 1
POLY(AMIC ACID)
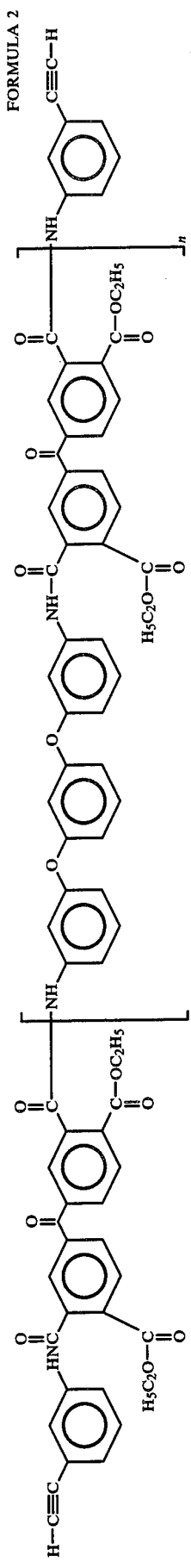
FORMULA 2
POLY(AMIC ESTER)
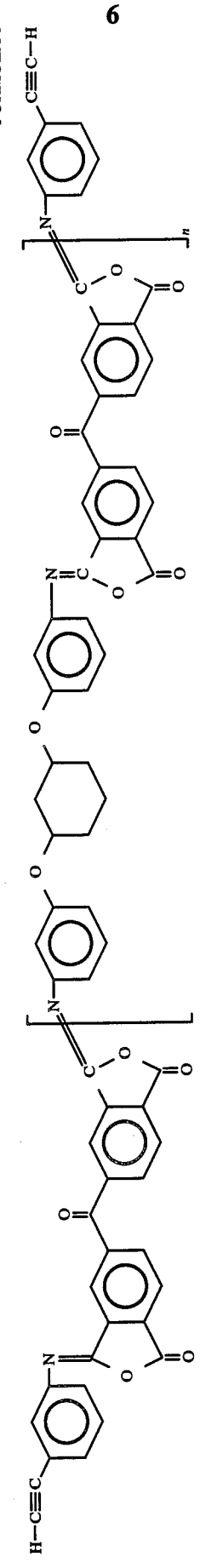
FORMULA 3
POLY(ISOIMIDE)

The polymerizable oligomers of the present invention are soluble in common organic solvents, for example, alcohols, ketones, ethers, amides, etc., a typical exemplary solvent being N-metyl pyrrolidinone (NMP). Since they are substituted with reactive terminae they can be cured or crosslinked to yield the desired dielectric and/or passivation material in situ to provide a strong three-dimensional network which provides the desired cured polyimide of high molecular weight and good thermal and chemical properties (as opposed to conventional polyimides which cure to yield a two-dimensional network).

Mixtures of solvents can be used if desired, but we currently see no benefit to using such mixtures unless oligomer as obtained from the vendor is in a solvent and more economical solvents are available. In such cases, a mixture of compatible solvents should be useful.

Where the oligomer is used as obtained from the vendor, the solvent content of the "as obtained" oligomer should be taken into account in determining the final amount of solvent needed for coating.

There are certain differences between the polyamic acid/ester, isoimide, imide, and analogue forms, and certain are preferred as now discussed.

As received, the Thermid-LR600 amic acid (vendor information) of formula 1 has a molecular weight range of from about 600 to about 10,000. This material also contains a small amount of a gel fraction that appears on all GPC analysis as a high molecular weight fraction, e.g., on the order of 3,000,000. To obtain excellent wetting and film forming properties, it is most preferred that this commercial material be fractionated to remove the high molecular weight components, leaving a most preferred molecular weight fraction on the order of about 2,500 to about 3,000 (GPC analysis), with only traces of the gel fraction remaining.

Fractionation is performed in a conventional manner by dissolving the product as received in N-methyl pyrrolidinone (NMP), methyl isobutyl ketone and methyl alcohol, filtering the same through a one micron filter (which removes undissolved material having a molecular weight over about 4,000), precipitating the same in toluene to remove a low molecular weight fraction, collecting the solids, dissolving the solids in acetone, filtering the same through a one micron filter, reprecipating into toluene, collecting the resulting solid and drying, whereafter the resulting product having a molecular weight of about 2,500 to about 3,000 is dissolved in NMP and passed through a one micron filter to prepare the desired coating solution.

Fractionation should also reduce the ionic content of the polyamic acid and remove unreacted monomers which might contaminate the resin and reduce its thermal stability.

The fractionated product can be dissolved in a variety of ketonic solvents, NMP, etc., and exhibits improved wetting and film forming properties as compared to the as received material, providing defect-free smooth films.

Other polymerizable oligomers as received from the vendor have a number average molecular weight range of from about 600~1,000 to about 10,000, as earlier indicated.

The isoimide of formula 3 as received (Thermid IP-600) is pre-cyclized from the amic acid of formula 1 during synthesis to yield the isomer of the imide. The isoimide of formula 3 is kinetically preferred but the imide is thermo-dynamically preferred as it is more stable and is, in any case, obtained upon heating either the amic acid of formula 1 or the isoimide of formula 3.

The polymerizable oligomers can be fully cured by heating at 0.5 hours at 200° C., 0.5 hours at 300° C. and 4 hours at 400° C., with all curing above 85° C. being done under nitrogen. A consistent low rate of weight loss of equal to or less than 0.12 wt%/hour was observed, an acceptable value. This curing cycle is not mandatory, nor critical, and other curing cycles are later provided.

It is also contemplated in accordance with the present invention that copolymers of the oligomers of the present invention will be useful. An example of such a copolymer would be the polymerization product of an acetylene terminated oligomer with triethynyl benzene. Such copolymers are expected to have a higher moduli due to the presence of polytriethynyl benzene regions and are expected to have higher thermal and hydrolytic stability. The reduction in imide content would also reduce the susceptability of the cured polyimide to absorb water and polar solvents.

The polymerizable oligomers of the present invention which are end-capped with a vinyl or acetylenic end group per the present invention, most preferably an acetylenic group, which have formula 3 (the polyisoimide) are preferred to the polyamic acid of formula 1 and polyamic esters of formula 2. The polyisoimides have particular advantage over the polyimide form of the oligomer described by Takeda et al. for the following reasons.

The isoimide has a high degree of solubility, comparable to the amic acid, and will form concentrated solutions suitable for spin coating in ketonic solvents as well as NMP. The ketonic solvents appear to improve wetting and film forming properties. The polyimide form of oligomers, however, dissolves only in NMP.

The polyisoimide softens at about 160° C., well below the onset of gelation (190° C.; 6 minutes) and this capacity to soften before cross-linking occurs should result in superior planarization and film uniformity. The imide and amic acid soften at above 190° C.

The polyisoimide rearranges thermally to yield a cross-linked imide without the evolution of water or alcohol. This is a substantial benefit since water is tenaciously bound in polyimides and is not completely removed until samples are heated at 350° C., or above, for a minimum of 30 minutes. Continuous outgassing of solvent (NMF) and water during cross-linking could result in undesirable porosity and pin-holes.

The molecular weight distribution of the polyimide as received (powder form) is about 2,000–4,000 (GPC analysis) with not trace of a high molecular weight gel fraction. Thus, as opposed to the polyamic acid as received, Thermid-LR 600, no additional purification and/or fractionation need be conducted.

At present, we believe that only the polyamic acid as received requires fractionation.

Upon heating (150°–300° C.) the polymerizable oligomers of the present invention undergo three types of reactions: imidization via dehydration of the amic acid or elimination of alcohol from the amic ester functionalities and thermal rearrangement of the isoimide to yield the imide and radically induced addition reactions of the reactive terminal groups, be they vinyl or acetylinic end groups. The terminal end groups can add to their terminal end groups generating cross-links at chain ends or with carbonyl groups contained within the newly-formed polyimide chain. These addition reactions deactivate the requisite reactive functional groups and generate the desired three-dimensional polymer network in the cured polyimide. As earlier noted, conventional linear polyimide resins undergo only imidization upon heating and result in a two-dimensional network.

As earlier indicated, the oligomers of the present invention can be used to form areas which are to serve as dielectric isolation/passivation regions in electronic components of diverse natures. However, the oligomers of the present invention, due to their excellent characteristics, which will later be discussed, find particular application in filling what have come to be known as deep dielectric isolation trenches. For example, such trenches typically have the following dimensions: 2 $\mu m \times 6$ $\mu m$ to 0.5 $\mu m \times 5.5$ $\mu m$ (width then depth). The present invention is not, of course, limited thereto.

One particular advantage is that the oligomers of the present invention can be used at high concentrations with a low solvent content. As indicated, oligomer concentrations up to about 70~80 weight percent or more, based on solution weight (hereinafter same basis unless otherwise indicated) can be used. We believe most typically oligomer concentrations on the order of about 30 weight percent to about 60 weight percent will be conventionally used on a commercial process line scale.

The starting oligomer solutions are formed in a simple manner; the oligomer is simply well mixed with the desired solvent to provide an oligomer solution of the desired proportions. Mixing is typically at ambient temperature, but there is no reason why lower or higher temperatures could not be used. Lower temperatures tend to increase solution viscosity and higher temperatures tend to increase solvent volatilization in some cases. Accordingly, we currently see no benefit to using conditions other than at ambient. Mixing can be performed using any conventional mixing device.

The oligomer-containing solution can be applied to the desired portion of the electronic component by any conventional means, for example, spin casting, spraying, meniscus coating, etc.

One major advantage of using the oligomers of the present invention is that they can be thermally or catalytically cured at relatively low temperatures. Typically if a catalyst is used, curing is at a lower temperature than if thermal curing per se is used. If desired, of course, curing can be assisted by the use of irradiation such as electron beams, x-rays, etc.

Following curing, the oligomers result in a polymer having a three-dimensional network. As cured, of course, molecular weight cannot be determined. At catalyst concentrations as given above, usually the end groups comprise on the order of about 1 to about 2 percent by weight of the oligomers.

After the oligomer-containing solution of the present invention is applied, it can be dried followed by a separate curing step or, more preferably, we use a combined dry/cure cycle. The major benefit to a dry/cure cycle is that, of course, in one processing step we can effect both functions of drying and curing.

In those instances where a separate drying step is used, we normally prefer to use a temperature below the temperature at which any substantial degree of crosslinking occurs. We believe, however, that so long as excessive crosslinking does not occur such that solvent evaporation might harm the desired dielectric isolation, the initiation of curing during solvent drive-off will probably not be harmful. However, we normally prefer to drive off or purge solvent prior to the initation of any substantial degree of curing.

Typically, where a separate drying step is used this will be at a temperature less than about 100° C. for a time of from about ½ to about 2 hours, more generally about 1 hour. For example, where a catalytic cure is used, the temperature of solvent drive-off will be lower than the scission temperature for the catalyst used, for example, for dicumyl peroxide this is 190° C.

We generally, however, prefer to use a combined dry/cure process, whether the curing is catalytic or thermal.

Further, we most prefer to use a stepped dry/cure processing, i.e., where the temperature of the curing polyimide is raised through various steps. By using a stepped dry/cure, at lower temperatures we effect solvent drive-off from the polymerizable oligomer/solvent system (with optional catalyst being present), whereafter at higher temperatures curing is effected. While a stepped dry/cure cycle is not mandatory, this avoids the possibility that solvent evaporation might harm the desired dielectric isolation. Typically solvent drive-off is at a temperature below about 100° C. Times are as earlier given.

Thermal curing is then effected at a temperature of from about 200° C. to about 500° C., more preferably from about 200° C. to about 400° C. While not to be construed as limitative, thermal curing is usually completed in about 4 to 6 hours following the dry cycle of about ½ to about 2 hours, more typically in about 5½ hours.

Thermal curing is typically in an inert atmosphere such as nitrogen, argon etc., but we believe the potentially air or a vacuum can be used, but we see no current benefit to using the same.

For catalytic curing, most conveniently the organic peroxide curing agents are used. These may be freely selected from organic peroxide curing agents as are known in the art, for example, benzoyl peroxide, dicumyl peroxide, etc. The amount of curing agent is not important so long as the desired degree of curing is obtained, and such can readily be determined by one skilled in the art. Typically amounts of catalyst on the order of from about 0.05 to about 10 weight percent based on the weight of the polymerizable oligomer are used, based on the total amount of oligomer present. It is convenient to add the catalyst during the formation of the oligomer solution by blending the same with the oligomer and the desired solvent(s). The atmosphere is the same as for catalytic curing.

As is the case with thermal curing, we also prefer to use a combined dry/cure cycle with catalytic curing. The time period which might be considered devoted to the drying cycle is as above.

Typically, following the dry cycle, catalytic curing is effected in about 1 to about 2 hours or less at a temperature which is sufficient to activate the catalyst, typically for the organic peroxide catalyst (curing agents) this being on the order of about 185° C. to about 190° C., with the dry cycle being at a lower temperature.

If a radiation-induced curing catalytic curing is desired, typically this follows solvent drive off at the above conditions whereafter the desired radiation, e.g., ultraviolet, electron beams, etc., is applied to the oligomer/catalyst using conventional amounts of radiation to initiate the catalyst. Catalysts and amounts are as above described.

Following processing as above, the desired cured polyimide characterized by its three-dimensional network is obtained.

The polymerizable oligomers can be fully cured by heating at 0.5 hours at 200° C., 0.5 hours at 300° C. and 4 hours at 400° C., with all curing above 85° C. being done under nitrogen. An alternative cure cycle involves heating at 85° C. for 30 minutes, 170° C. for 1 hour, 200° C. for 1 hour (300° C. for 1 hour (this step is optional)) and 400° C. for $4\frac{1}{2}$ hours. The time between steps is unimportant and can be rapid. After completion of curing, the cooling rate is unimportant. One skilled in the art will easily appreciate that other curing cycles can be used with success, but we have found the above curing cycles to offer excellent results. A consistent low rate of weight loss of 0.12 weght%/hour or less was observed, an acceptable value.

Following curing, if it is desired or necessary to remove the cured polyimide of the present invention so as to planarize the surface thereof, this can be effected using a conventional reactive ion etching in a manner known in the art. Such is described in detail in "A Survey of Plasma-Etching Processes" by Richard L. Bersin, published in Solid State Technology, May 1976, pages 31-36 and "Reactive Ion Etching in Chlorinated Plasma" by Geraldine C. Schwartz et al, Solid State Technology, November 1980, pages 85-91, both hereby incorporated by reference. Following the procedure of these publications, the cured polyimide of the present invention can be uniformly etched back with no resultant residue.

Exemplifying the above, the oligomers per the present invention can be readily crosslinked and imidized by heating and that their physical properties can be further improved as a result of morphological changes that occur at higher temperatures, e.g., up to 500° C.

Having thus generally described the oligmers of the present invention, solutions containing the same, means of applying the same and means of curing the same to obtain the desired cured polyimide, we now turn to a detailed discussion of the superior properties of the cured polyimide of the present invention, which are primarily relevant from a device aspect, and to a discussion of the superior properties of the oligomers of the present invention, which are primarily of interest from the processing aspect since in the final device, of course, only the cured polyimide is present.

The cured polyimide contains essentially no voids, bubbles, non-wet areas and exhibits no cracking or crazing in common process solvents.

The cured polyimide can be uniformly etched back with no resultant residue.

The cured polyimide exhibits excellent adhesion to various surfaces including metals and inorganic components as are typically used in semiconductor devices, e.g., silicon, alumina and silicon nitride. Adhesion is so good that films of the cured polyimide could not be peeled off from silicon nitride even in the absence of an adhesion promoter. A comparable commercially available cured polyimide (Dupont 5878, trade name) shows this type of adhesion only in the presence of an adhesion promoter. While if desired an adhesion promoter can be used in accordance with the present invention, it is one substantial benefit of the present invention that an adhesion promoter is not necessary.

The coefficient of thermal expansion of the cured polyimide is $25.42 \times 10^{-6}$ $deg^{-1}$ which is compatible with the coefficient of thermal expansion of silicon, alumina and silicon nitride and is comparable to that of convention polyimides.

Since the cured polymide in the trench will remain as a device isolation dielectric, it must be thermally stable and remain substantially unaltered during personalization processing and total chip lifetime. Thermal cycling to temperatures as high as 500° C. can be involved while the material is contained in a bed of inorganic dielectrics. Long-term stability to such thermal cycling conditions is required for chip reliability.

The cured polyimide is thermally stable to 400° C., exhibits negligible outgassing after 10 hours at 400° C., no adhesion loss and no morphological changes. It is believed that the negligible outgassing is due to the presence of interchain crosslinks and although bond scission occurs as a result of heating, fewer volatile groups appear to be generated due to the presence of the crosslinks.

The cured polyimide has excellent electrical properties, e.g., its dielectric constant does not change after exposure to water or thermal cycling and it is resistant to polarization and charge inversion. Due to the higher hydrocarbon content of the cured polyimide and higher degree of crosslinking as compared to conventional polyimides, it is significantly more hydrophobic than conventional polyimides. For example, after exposure to 96% humidity for 1,000 hours the cured polyimide contains less than 1% water and exhibit no change in dielectric constant. The commercially available polyimide Kapton, in comparison, absorbs ~2.9% water under comparable conditions and shows a dielectric constant increased 11% over normal.

The increased hydrophobic nature of the cured polyimide also provides the cured polyimide with a minimal tendency to absorb process solvents, thereby reducing its tendency to swell or crack when exposed to, e.g., polar process solvents. This tendency to reduced swelling is a critical factor for trench isolation and is one of the most important variables in forming a successful trench isolation. Further, it is believed that the high degree of cross-linking in the cured polyimide of the present invention interfers with the crack propagation mechanism.

High temperature annealing is generally required to obtain optimum properties with conventional polyimides and this is also the case with the cured polyimides of the present invention. High temperature annealing is in accordance with the conditions used in the prior art for conventional polyimides.

Finally, the assembled three-dimensional network resulting from the radical coupling and addition reactions of the oligomer terminae is significantly more resistant to deformation and cracking than is the two-dimensional conventional polyimide structure, in particular, the cured polyimides of the present invention exhibit a high modulus and tensile strength. More specifically, the cured polyimides of the present invention do not exhibit cracking under thermal stressing and solvent stressing, when used to fill a trench, during post-curing processing.

The oligomers of the present invention also exhibit high desirable characteristics for use in forming dielectric and/or passivation elements in electronic components, though these properties are primarily from the process viewpoint as opposed to the final device viewpoint.

Because of their low molecular weight, solutions of high solids content, e.g., 40-60%, can be prepared that are sufficiently fluid to trench fill and planarize with a single application using simple techniques which result in less solvent content and significantly less shrinkage and stress due to volume contraction upon solvent evaporation. In contrast, solutions of high molecular weight polyimides such as D-5878 (available from du Pont) cannot be used in concentrated solution form due to the prohibitively high viscosity of the resulting solution. Typically usable solutions comprise about 12-15% of such a polyimide and result in voids, delamination and excessive shrinkage when used in trench fill applications.

Because of the low molecular weight of the oligomers, they dissolve in organic alcohols, ketones, ethers, amides, etc., resulting in solutions which readily wet a variety of surfaces, e.g., silicon nitride, ceramic surfaces, silicion dioxide, etc.

Although high molecular weight is desirable in the cured polyimide of the present invention, it is undesirable in the oligomer of the present invention. Increasing the molecular weight increases the viscosity of the oligomer solution at constant mass, and results in solutions with poor levelling and wetting properties. For example, a solution of 45% of the polyamic acid oligomer of the present invention has a viscosity of 300 cp whereas a 40% solution of a commercially available polyamic acid (Dupont 5878, trade name) has a viscosity of 50-80 kcp.

Having thus generally described the invention, the following working example(s) is/are provided to illustrate currently preferred modes of practicing the same.

EXAMPLE 1

As earlier indicated, the polymerizable oligomers of the present invention are essentially used as a replacement for dielectric isolation in conventional semiconductor devices and the like. Reference should be made to the earlier patents hereby incorporated by reference.

In this particular instance, a conventional trenched silicon wafer was used, trench dimensions being 2.0 microns (width)×5.5 microns (depth). The polymerizable oligomer selected was Thermid IP-600, the isoimide. It was received in powder form from the vendor and had a molecular weight of from about 2,000 to about 4,000.

It was mixed with NMP at ambient temperature to provide an isomide solution containing 37% by weight isoimide based on solution weight.

It was then spin coated in a conventional manner on a trenched wafer as above described.

Following application, the polymerizable oligomer solution was subjected to a combined dry/cure cycle at the following conditions in an inert atmosphere (nitrogen) in a conventional heating furnace.

The time of temperature elevation was not important and was merely the time necessary to raise the atmosphere in the dry/cure furnace used from one temperature to the next. The times and temperatures were (starting at ambient): at 85° C. for 10 minutes; at 170° C. for one-half hour; at 200° C. for one-half hour; at 300° C. for one-half hour; at 400° C. for four and one-half hours. No catalyst was used.

Following processing as above, the trenched wafer was removed from the furnace and permitted to cool in the air at ambient conditions.

Conditions of cooling are not important; of course, the cooling rate should not be so fast that any device component would crack or the like, but this will be apparent to one skilled in the art.

Following cooling, the surface of the device was oxygen plasma RIE etched in a standard conventional diode device.

The dielectric isolation obtained exhibited the benefits earlier described.

Fractionated polyamic acid was also used with excellent results as a trench fill material. Solutions in NMP were spun onto trenched structures and step-wise heated to 400° C. to effect full cure. The resulting devices had trenches with no voids or "dewets" and excellent local planarization, i.e., equal to or greater than 95%. Analysis after plasma etch back established that the reactive ion etching was uniform and did not result in any residues.

Trench filling with the isoimide showed excellent local trench polarization with thin (1.3 micron) application. Material flow occurs at 160° C. prior to cross-linking permitting excellent levelling and subsequent plasma etch back produces a planar trench structure. Since we normally use a conventional RIE "etch back" after curing, usually the complete top of the wafer is coated with the polymerizable oligomer solution, e.g., 0.5~5 micron dry thickness.

While there has been described what are at present considered to be the preferred embodiments of this invention, it will be obvious to those skilled in the art that varous changes and modifications may be made therein without departing from the invention, and it is, therefore, intended to cover all such changes and modifications as fall within the true spirit and scope of the invention.

Having thus generally described the invention, what is claimed is:

1. A method for forming dielectrically isolated island regions in a semiconductor substrate comprising:
   (a) forming in said substrate a recess trench pattern defining a plurality of isolated island regions;
   (b) filling said trenches with a composition containing as a component a polymerizable oligomer selected from the group consisting of polyamic acids, the corresponding polyamic esters, the corresponding polyisoimides, and mixtures therein, wherein said polymerizable oligomer is vinyl and/or acetylenic end capped;
   (c) curing composition in situ in the trenches to form an imidized three dimensional dielectric polyimide therein.

2. The method of claim 1 including forming an integrated circuit in the island regions.

3. The method of claim 1 wherein the number average molecular weight of said polymerizable oligomers ranges from about 1,500 to about 8,000.

4. The method of claim 3 wherein said molecular weight ranges from about 2,000 to about 4,000.

5. The method of claim 3 wherein said polymerizable oligomer comprises polyisoimide.

6. The method of claim 5 wherein said recessed trenches range in width from about 0.5 μm to about 2 μm and range in depth from about 5.5 μm to about 6 μm.

7. The method of claim 5 wherein said polyisoimide concentration in said composition used to fill said trenches is less than about 80 weight percent.

8. The method of claim 7 wherein said polyisoimide concentration ranges from about 30 to about 60 weight percent.

9. The method of claim 7 wherein said curing is accomplished using a combined dry/cure cycle wherein said cycle is initiated at about 85° C. and stepped to about 170° C. followed by about 200° C., followed by about 300° C., and a final curing step at about 400° C.

10. The method of claim 4 wherein a combined dry/cure cycle is utilized and wherein one step in said cure cycle occurs at a temperature ranging from about 160° C. to 190° C. during which softening and planarization of the dried polyisoimide is obtained prior to crosslinking at subsequent higher temperatures.

11. The method of claim 5 including an additional post curing step at about 500° C.

12. The method of claim 1 wherein said polymerizable oligomer comprises polyisoimide.

13. The method of claim 12 wherein said curing includes at least one 400° C. curing step.

14. The method of claim 13 wherein said cured, imidized, polyisoimide is subsequently covered with an inorganic dielectric.

15. A method of forming multilevel metallurgy on a substrate comprising an integrated circuit device, comprising:
(a) applying a coating to the surface of the substrate comprising the integrated circuit device thereby filling and substantially planarizing the substrate surface, using a composition containing a polymerizable oligomer selected from the group consisting of polyamic acids, the corresponding polyamic esters, the corresponding polyisoimides, and mixtures thereof, wherein the polymerizable oligomer is vinyl and/or acetylenic end-capped;
(b) curing the composition to form a three-dimensional imidized layer thereof,
(c) forming via openings in the imidized layer extending to conductive portions of the integrated circuit device; and
(d) forming a conductive pattern on the imidized layer and in the via openings to at least one of the underlaying conductive portions of the integrated circuit device.

16. The method of claim 15 wherein the polymerizable oligomer includes at least one component selected from the group consisting of polyamic acids and polyamic esters, and wherein the curing is accomplished using a stepped cure cycle.

17. The method of claim 11 wherein the polyamic acids have been fractionated to remove molecular weight components exceeding a molecular weight of about 4,000.

18. The method of claim 15 wherein the curing is accomplished using a stepped cure cycle within a temperature range from about 85° C. to about 400° C.

19. The method of claim 15 wherein the curing is accomplished using a catalytic cure.

20. The method of claim 19 wherein the curing is accomplished using radiation to initiate catalyst activity.

21. The method of claim 15 including the additional step of:
(e) postcuring the composition in situ at temperatures up to about 500° C.

22. The method of claim 15, including repeating steps (a) through (d) to the desired multilevel of metallurgy.

23. The method of claim 15 wherein the polymerizable oligomer comprises at least one polyisoimide.

24. The method of claim 23 wherein the curing is accomplished within a temperature range of about 85° C. to about 400° C.

25. The method of claim 15 wherein the composition includes triethynyl benzene to be copolymerized with the polymerizable oligomer.

* * * * *